(12) United States Patent
Tamura

(10) Patent No.: US 6,846,761 B2
(45) Date of Patent: Jan. 25, 2005

(54) LOW-DIELECTRIC-CONSTANT GLASS FIBER AND GLASS FIBER FABRIC MADE THEREOF

(75) Inventor: Shinichi Tamura, Fukushima (JP)

(73) Assignee: Nitto Boseki Co., Ltd., Fukushima-ken (JP)

(*) Notice: Subject to any disclaimer, the term of this patent is extended or adjusted under 35 U.S.C. 154(b) by 0 days.

(21) Appl. No.: 10/285,503

(22) Filed: Nov. 1, 2002

(65) Prior Publication Data

US 2003/0054936 A1 Mar. 20, 2003

Related U.S. Application Data

(63) Continuation of application No. 09/647,989, filed as application No. PCT/JP99/01801 on Apr. 6, 1999, now abandoned.

(30) Foreign Application Priority Data

Apr. 14, 1998 (JP) ........................................ H10-102366

(51) Int. Cl.$^7$ ........................... C03C 13/02; C03C 13/06
(52) U.S. Cl. ........................... 501/38; 501/35; 501/36; 501/69; 501/70
(58) Field of Search ............................. 501/16, 35–38, 501/69, 70

(56) References Cited

U.S. PATENT DOCUMENTS 4,824,806 A    4/1989  Yokoi et al.
5,958,808 A    9/1999  Mori et al.
6,309,990 B2  10/2001  Tamura et al.

FOREIGN PATENT DOCUMENTS

| JP | 62-226839 | 10/1987 |
| JP | 64-51345 | 2/1989 |
| JP | 6-219780 | 8/1994 |
| JP | 7-10598 | 1/1995 |
| JP | 8-333137 | 12/1996 |
| JP | 9-74255 | 3/1997 |
| JP | 10167759 | 6/1998 |
| WO | WO 98/16482 | 4/1998 |

OTHER PUBLICATIONS

Machine translation of JP 9–74255.*
Machine translation of JP 7–10598.*
Machine translation of JP10–167759.*

* cited by examiner

*Primary Examiner*—Karl Group
*Assistant Examiner*—Elizabeth A. Bolden
(74) *Attorney, Agent, or Firm*—Nixon & Vanderhye P.C.

(57) ABSTRACT

Low-dielectric-constant glass fibers having a glass composition comprising, by weight %, 50 to 60% of $SiO_2$, 10 to 18% of $Al_2O_3$, 14% to less than 20% of $B_2O_3$, 1% to less than 6% of MgO, 2 to 5% of CaO, 0.5 to 5% of $TiO_2$, 0 to 0.3% of $Li_2O$, 0 to 0.3% of $Na_2O$, 0 to 0.5% of $K_2O$ and 0 to 2% of $F_2$, the content of MgO+CaO being 4 to 11% and the content of $Li_2O+Na_2O+K_2O$ being 0 to 0.6%. The glass fiber has a low dielectric constant and a low dielectric tangent, is excellent in productivity and workability and is also excellent in water resistance, and the glass fiber is suitable for reinforcing printed wiring boards for high-density circuits.

5 Claims, No Drawings

LOW-DIELECTRIC-CONSTANT GLASS FIBER AND GLASS FIBER FABRIC MADE THEREOF

CROSS REFERENCE TO RELATED APPLICATIONS

This application is a continuation of Application Ser. No. 09/647,989 filed Oct. 25, 2000, now abandoned, which in turn is a U.S. national stage of PCT/JP99/01801 filed Apr. 6, 1999, the entire content of which is hereby incorporated by reference in this application.

TECHNICAL FIELD

The present invention relates to a low-dielectric-constant glass fiber and a glass fiber fabric made thereof. More specifically, it relates to a low-dielectric-constant glass fiber which has a low dielectric tangent suitable for use for reinforcing a high-density printed wiring board required to have a low dielectric tangent in particular and its peripheral plastic members and which is excellent in water resistance, productivity and workability, and a glass fiber fabric made of the above low-dielectric-constant glass fiber.

TECHNICAL BACKGROUND

In recent years, with the age of highly computerized societies, communication machines and equipment for satellite broadcasting, mobile phones, etc., tend to be digitized, and signal processing tends to be quicker. These communication machines, etc., have printed wiring boards constituted of composite materials composed of materials such as a reinforcing material, a resin, a modifier, a filler, and the like. Further, glass fibers are widely used as a reinforcing material for their peripheral plastic members. Conventionally, E glass is known as a commercially produced glass fiber of this kind.

When an alternate current is flowed in glass, generally, the glass absorbs energy with regard to the alternate current and absorbs it as heat. The dielectric loss energy to be absorbed is in proportion to a dielectric constant and a dielectric tangent which are determined by the components and the structure of the glass, and is shown by the following expression.

$$W = kfv^2 \times \epsilon \tan \delta$$

in which W is a dielectric loss energy, k is a constant, f is a frequency, $v^2$ is a potential gradient, $\epsilon$ is a dielectric constant, and $\tan \delta$ is a dielectric tangent.

The above expression shows that with an increase in the dielectric constant and the dielectric tangent, or with an increase in the frequency, the dielectric loss increases.

E glass, for example, has a dielectric constant of 6.7 and a dielectric tangent of $12 \times 10^{-4}$ at a frequency of 1 MHz at room temperature, and a printed wiring board using E glass is insufficient for complying with demands of a higher density and a higher processing speed. There are therefore desired glasses having a lower dielectric constant and a lower dielectric tangent than the E glass. Among them is a glass called D glass. D glass is, for example, a glass having a composition containing, by weight %, 75.3% of $SiO_2$, 20.5% of $B_2O_3$, 0.4% of MgO, 0.6% of CaO, 0.6% of $Li_2O$, 1.1% of $Na_2O$ and 1.5% of $K_2O$. For example, it has a dielectric constant of 4.3 and a dielectric tangent of $10 \times 10^{-4}$ at a frequency of 1 MHz at room temperature.

However, D glass has the following defects. Since it has poor meltability and is liable to cause striae and foams, a glass fiber frequently breaks during its spinning step, and it is poor in productivity and, workability. Further, since it has a very high spinning temperature, the lifetime of a furnace is caused to decrease. Moreover, there is another problem that since D glass has poor water resistance and poor adhesion to a resin, it is liable to peel from a resin of a printed wiring board so that no high reliability can be obtained when it is used for a printed wiring board.

JP-A-6-219780 discloses a low-dielectric-constant glass comprising, by weight %, 50.0 to 65.0% of $SiO_2$, 10.0 to 18.0% of $Al_2O_3$, 11.0 to 25.0% of $B_2O_3$, 6.0 to 14.0% of MgO, 1.0 to 10.0% of CaO and 0 to 10.0% of ZnO, the content of MgO+CaO+ZnO being 10.5 to 15%. In the above glass, it is intended to decrease a spinning temperature in order to improve productivity particularly by incorporating at least 6% of MgO and adjusting CaO+MgO+ZnO to at least 10.5%. Since, however, MgO, a component which is highly liable to undergo phase separation and give a high dielectric tangent, is incorporated in an amount of 6% or more, no sufficient water resistance can be obtained, and the dielectric tangent that can be achieved by the glass is approximately $10 \times 10^{-4}$.

The present inventors have already proposed, by JP-A-8-333137, a glass comprising, by weight %, 50 to 60% of $SiO_2$, 10 to 20% of $Al_2O_3$, 20 to 30% of $B_2O_3$, 0 to 5% of CaO, 0 to 4% of MgO, 0 to 0.5% of $Li_2O+Na_2O+K_2O$ and 0.5 to 5% of $TiO_2$. The above glass retains a low dielectric constant and a low dielectric tangent and at the same time shows excellent properties with regard to workability and productivity during a spinning step. However, it shows a relatively high volatilization amount of $B_2O_3$, and during the spinning of a glass fiber, the glass fiber sometimes undergoes breaking due to $B_2O_3$-induced adhering around a bushing nozzle. It has been therefore still desired to further improve the fiber in workability and productivity.

When the above glass fiber is used for a printed wiring board, generally, a plurality of fabrics made of the glass fiber are laminated, and the formed laminate is used for a printed wiring board.

DISCLOSURE OF THE INVENTION

Under the circumstances, it is a first object of the present invention to provide a glass fiber which has a low dielectric constant and a low dielectric tangent and which is excellent in productivity and workability and is also excellent in water resistance.

It is a second object of the present invention to provide a glass fiber fabric made of the above glass fiber having excellent properties.

For achieving the above objects, the present inventors have diligent studies and as a result have found the following. In a composition of the glass fiber, the glass is improved in meltability particularly by incorporating, by weight %, 60% or less of $SiO_2$ and 0.5 to 5% of $TiO_2$, and further, there can be obtained a low-dielectric-constant and low-dielectric-tangent glass fiber which is excellent in productivity due to prevention of volatilization of $B_2O_3$ and is also excellent in water resistance by incorporating less than 20% of $B_2O_3$ and 2 to 5% of CaO. On the basis of the above finding, the present invention has been completed.

That is, according to the present invention, (1) there is provided a low-dielectric-constant glass fiber having a glass composition comprising, by weight %, 50 to 60% of $SiO_2$, 10 to 18% of $Al_2O_3$, 14% to less than 20% of $B_2O_3$, 1% to less than 6% of MgO, 2 to 5% of CaO, 0.5 to 5% of $TiO_2$, 0 to 0.3% of $Li_2O$, 0 to 0.3% of $Na_2O$, 0 to 0.5% of $K_2O$ and 0 to 2% of $F_2$, the content of MgO+CaO being 4 to 11% and the content of $Li_2O+Na_2O+K_2O$ being 0 to 0.6%, and (2) there is also provided a glass fiber fabric made of the above low-dielectric-constant glass fiber.

BEST MODE FOR PRACTICING THE INVENTION

In the low-dielectric-constant glass fiber of the present invention, the composition there is limited for the following reasons.

$SiO_2$ is a component to form a glass network together with $Al_2O_3$ and $B_2O_3$. When the content of $SiO_2$ is less than 50% by weight, not only the glass fiber has too large a dielectric constant, but it has low water resistance and low acid resistance, so that the glass fiber and a printed wiring board using it as a reinforcing material are caused to deteriorate. When the above content exceeds 60% by weight, the viscosity is too high, and it is sometimes difficult to form a fiber during spinning. The content of $SiO_2$ is therefore limited to 50 to 60% by weight, and it is preferably 53 to 57% by weight.

$Al_2O_3$ is liable to undergo phase separation when its content is less than 10% by weight, and the glass therefore shows poor in water resistance. When the content thereof exceeds 18% by weight, the liquidus temperature of the glass increases to cause poor spinnability. The content of $Al_2O_3$ is therefore limited to 10 to 18% by weight, and it is preferably 13 to 16% by weight.

$B_2O_3$ is a component which is used as a flux to decrease a viscosity and ease melting. When the content thereof is less than 14% by weight, however, the dielectric constant and the dielectric tangent of the fiber are too large. When it is 20% by weight or more, a volatilization amount of $B_2O_3$ during melting increases, so that breaking of a glass fiber is observed due to $B_2O_3$-induced adhering around a bushing nozzle during the spinning of the glass fiber, which sometimes causes a problem on workability and productivity. Further, in some cases, no homogeneous glass can be obtained, and further, the glass is too poor in water resistance. The content of $B_2O_3$ is therefore limited to 14 to less than 20% by weight, and it is preferably 15 to 19.5% by weight.

MgO is a component which is used as a flux to decrease a viscosity and ease melting. When the content of MgO is less than 1% by weight, striae increase and the volatilization amount of $B_2O_3$ increases. When the content of MgO is 6% by weight or more, however, phase separability is intensified, so that the water resistance decreases, and further, the dielectric constant and the dielectric tangent are too large. The content of MgO is therefore limited to 1 to less than 6% by weight, and it is preferably 3 to less than 6% by weight.

CaO is a component which is used as a flux together with MgO to decrease a viscosity and ease melting, and it is also a component which inhibits the conversion of $B_2O_3$ to $H_3BO_3$, so that it improves the glass in water resistance. When the content of CaO is less than 2% by weight, the meltability comes to be poor, and the water resistance is too poor. When it exceeds 5% by weight, the dielectric constant and the dielectric tangent are too large. The content of CaO is therefore limited to 2 to 5% by weight.

When the total content of MgO and CaO is less than 4% by weight, the viscosity is too high, and the meltability is too poor. When it exceeds 11% by weight, the dielectric constant and the dielectric tangent are too large. The above total content is therefore limited to 4 to 11% by weight, and it is preferably 7 to 10% by weight.

$Li_2O$, $Na_2O$ and $K_2O$ are all used as a flux in some cases. When the content of each of $Li_2O$ and $Na_2O$ exceeds 0.3% by weight, or when the content of $K_2O$ exceeds 0.5% by weight, the dielectric tangent is too high. The content of each of $Li_2O$ and $Na_2O$ is limited to 0 to 0.3% by weight, and the content of $K_2O$ is therefore limited to 0 to 0.5% by weight. Preferably, the content of $Li_2O$ is 0 to 0.2% by weight, the content of $Na_2O$ is 0 to 0.2% by weight, and the content of $K_2O$ is 0 to 0.2% by weight.

When the total content of $Li_2O$, $Na_2O$ and $K_2O$ exceeds 0.6% by weight, the dielectric tangent is too high, and the water resistance is also poor. The total content of $Li_2O+Na_2O+K_2O$ is limited to 0 to 0.6% by weight, and it is preferably 0.2 to 0.5% by weight.

$TiO_2$ is effective for decreasing the dielectric tangent, and further, it has remarkably excellent effects on the inhibition of separation of a melt during initial melting and on the reduction of a viscosity. Further it decreases scum which occurs on a furnace surface. When the content thereof is less than 0.5% by weight, these effects are small. When it exceeds 5% by weight, it is liable to cause phase separation, which results in poor chemical durability of the glass. The content of $TiO_2$ is therefore limited to 0.5 to 5% by weight, and it is preferably 1 to 4% by weight.

In the composition of the glass fiber of the present invention, $F_2$ not only works, as a flux, to decrease the viscosity of the glass, but also decreases the dielectric constant and, particularly, the dielectric tangent. When the content of $F_2$ exceeds 2% by weight, however, the phase separability is intensified, and at the same, the heat resistance is poor in some cases. The content of $F_2$ is therefore limited to 0 to 2% by weight, and it is preferably 0.2 to 1% by weight.

Besides the above components, the composition of the glass fiber of the present invention may contain one or more components such as ZnO, SrO, $Fe_2O_3$, $Cr_2O_3$, $As_2O_3$, $Sb_2O_3$, $P_2O_5$, $ZrO_2$, $Cl_2$, $SO_3$, $MoO_2$, etc., in an amount up to 3% by weight so long as the properties of the glass are not impaired.

The composition of the glass fiber of the present invention preferably contains, by weight %, 53 to 57% of $SiO_2$, 13 to 16% of $Al_2O_3$, 15 to 19.5% of $B_2O_3$, 3% to less than 6% of MgO, 2 to 5% of CaO, 1 to 4% of $TiO_2$, 0 to 0.2% of $Li_2O$, 0 to 0.2% of $Na_2O$, 0 to 0.2% of $K_2O$ and 0.2 to 1% of $F_2$, the content of MgO+CaO being 7 to 10% and the content of $Li_2O+Na_2O+K_2O$ being 0.2 to 0.5%.

As far as preferred physical properties of the low-dielectric-constant glass fiber of the present invention are concerned, the low-dielectric-constant glass fiber has a dielectric constant of 5.0 or less, a dielectric tangent of $10 \times 10^{-4}$ or less, a spinning temperature (temperature at which the glass viscosity comes to be $1 \times 10^2$ Pa·s) of 1,350° C. or lower, a $B_2O_3$ volatilization amount of 4 ppm or less and water-resistance loss of 0.5% by weight or less.

The dielectric constant and the dielectric tangent refer to values obtained by melting a glass cullet in the form of a plate, gradually cooling the melt to prepare a sample having a diameter of 45 mm and a thickness of 2 mm and having both surfaces optically polished, and measuring the sample at a frequency of 1 MHz at room temperature with a precision LCR meter (supplied by Hewlett-Packard) as a measuring device. The $B_2O_3$ volatilization amount refers to a value obtained by spinning a glass at a spinning temperature at which the glass has a viscosity of $1 \times 10^2$ Pa·s, providing a cooling plate near a bush nozzle concurrently with the spinning, so that a volatilization substance adheres, measuring the adhering substance for an amount and calculating a ratio (ppm) of the adhering substance amount to an amount of the withdrawn glass. The water-resistance loss refers to a value obtained by immersing a glass fiber in water at 133° C. for 24 hours and then determining a weight loss of glass components.

On example of the composition of the low-dielectric-constant glass of the present invention particularly preferably contains, by weight %, 54.7% of $SiO_2$, 15.0% of $Al_2O_3$, 19.0% of $B_2O_3$, 4.0% of MgO, 4.0% of CaO, 2.5% of $TiO_2$, 0.15% of $Li_2O$, 0.15% of $Na_2O$, 0.00% of $K_2O$ and 0.5% of $F_2$, the content of MgO+CaO being 8.0% and the content of $Li_2O+Na_2O+K_2O$ being 0.30%. Concerning physical properties of a glass fiber having the above composition, the dielectric constant is 4.7, the dielectric tangent is $8\times10^{-4}$, the spinning temperature is 1,310° C., the $B_2O_3$ volatilization amount is 4 ppm, and the water resistance loss is 0.4% by weight.

The low-dielectric-constant glass fiber of the present invention is produced according to production techniques of known glasses such as E glass, C glass and D glass.

The glass fiber of the present invention has a low dielectric constant and a low dielectric tangent and is suitable as a glass fiber for a printed wiring board, particularly for reinforcing a printed wiring board designed for a high-density circuiting and rapid processing of signals. Further, since it has a low spinning temperature, a decreased $B_2O_3$ volatilization amount and excellent water resistance, a low-dielectric-constant glass fiber having excellent product qualities can be stably obtained.

Further, substrates for various fiber-reinforced resins, such as a glass fiber woven fabric, a non-woven fabric, a glass powder, a glass chopped strand, etc., can be obtained from the low-dielectric-constant glass fiber of the present invention.

For example, the glass powder can be obtained by pulverizing a glass bulk, or by forming it into a glass fiber and pulverizing the glass fiber. The glass bulk or the formed glass fiber can be pulverized with a known apparatus such as a ball mill, a fret mill, a hammer mill, an orient mill or an impeller mill, and the glass powder is obtained with one of these mills or a combination of these mills.

Further, various substrates formed of the glass fiber of the present invention such as a woven fabric, a non-woven fabric, a knitted product, a chopped strand, a roving, a glass powder and a mat and composite materials (e.g., a sheet molding compound, a bulk molding compound and a prepreg) formed of mixtures of these substrates with various thermosetting resins or thermoplastic resins can be used as substrates for reinforcement of various resins for communication machines and equipment and their peripheral members by utilizing the low dielectric constant and the low dielectric tangent thereof.

The present invention also provides a glass fiber fabric made of the above low-dielectric-constant glass fiber of the present invention.

The glass fiber fabric of the present invention is suitable for use particularly as a substrate for reinforcement of a laminate for a printed wiring board by utilizing its low dielectric constant and a low dielectric tangent.

The present invention will be explained more in detail with reference to Examples hereinafter, while the present invention shall not be limited by these Examples.

EXAMPLES 1–6

Table 1 shows compositions of the low-dielectric-constant glass fiber of the present invention. In each Example, a batch prepared to have a glass composition of a sample shown in Table 1 was placed in a platinum crucible and melted in an electric furnace with stirring under conditions of 1,500 to 1,550° C. and 8 hours. Then, the resultant molten glass was cast onto a carbon plate to obtain a glass cullet. The glass cullet was melted in the form a plate and gradually cooled to give a sample having a diameter of 45 mm and a thickness of 2 mm and having both surfaces optically polished. The sample was measured for a dielectric constant and a dielectric tangent at a frequency of 1 MHz at room temperature with a precision LCR meter (supplied by Hewlett-Packard) as a measuring device.

The above glass cullet was poured into a glass fiber manufacturing furnace and then a fiber was spun at a temperature at which the glass had a viscosity of $1\times10^2$ Pa·s. In this case, a cooling plate was provided near a bushing nozzle to allow a volatilization substance to adhere thereto, and the volatilization substance is measured for an amount. As a $B_2O_3$ volatilization amount, a ratio (ppm) of the amount of the adhering substance to the weight of a withdrawn glass was calculated.

For water resistance, the glass fiber obtained by the spinning was immersed in water at 133° C. for 24 hours, and then a weight loss of glass components was measured. A weight loss ratio calculated from the weight loss was expressed as "water-resistance loss". Table 1 shows these measurement results.

TABLE 1

| | | Example | | | | | |
|---|---|---|---|---|---|---|---|
| | | 1 | 2 | 3 | 4 | 5 | 6 |
| Glass composition (wt %) | $SiO_2$ | 53.0 | 55.0 | 57.0 | 55.5 | 54.5 | 54.7 |
| | $B_2O_3$ | 20.0 | 18.0 | 15.5 | 17.0 | 19.0 | 19.0 |
| | $Al_2O_3$ | 14.7 | 16.0 | 15.0 | 13.0 | 16.0 | 15.0 |
| | CaO | 4.0 | 2.0 | 4.7 | 5.0 | 4.7 | 4.0 |
| | MgO | 4.0 | 5.7 | 5.0 | 4.7 | 3.0 | 4.0 |
| | MgO + CaO | 8.0 | 7.7 | 9.7 | 9.7 | 7.7 | 8.0 |
| | $Li_2O$ | 0.15 | 0.15 | 0.15 | 0.15 | 0.15 | 0.15 |
| | $Na_2O$ | 0.15 | 0.15 | 0.15 | 0.15 | 0.15 | 0.15 |
| | $K_2O$ | 0.00 | 0.00 | 0.00 | 0.00 | 0.00 | 0.00 |
| | $Li_2O + Na_2O + K_2O$ | 0.30 | 0.30 | 0.30 | 0.30 | 0.30 | 0.30 |
| | $TiO_2$ | 3.0 | 2.0 | 2.0 | 4.0 | 2.0 | 2.5 |
| | $F_2$ | 1.0 | 1.0 | 0.5 | 0.5 | 0.5 | 0.5 |
| Properties | Dielectric constant | 4.7 | 4.7 | 4.7 | 4.7 | 4.7 | 4.7 |

TABLE 1-continued

|  | Example | | | | | |
|---|---|---|---|---|---|---|
|  | 1 | 2 | 3 | 4 | 5 | 6 |
| Dielectric tangent ($10^{-4}$) | 8 | 9 | 9 | 9 | 8 | 8 |
| Spinning temperature (° C.) | 1,295 | 1,336 | 1,340 | 1,315 | 1,312 | 1,310 |
| $B_2O_3$ volatilization amount (ppm) | 4 | 2 | 3 | 4 | 4 | 4 |
| Water-resistance loss | 0.4 | 0.4 | 0.4 | 0.4 | 0.4 | 0.4 |

COMPARATIVE EXAMPLES 1–4

Glass fibers of Comparative Examples 1 to 4 having compositions shown in Table 2 were prepared in the same manner as in Examples 1 to 6, and measurement results shown in Table 2 were obtained. The glass fiber of Comparative Example 1 corresponds to the glass fiber disclosed in JP-A-6-219780, and the glass fiber of Comparative Example 2 corresponds to the glass fiber disclosed in JP-A-8-333137.

The glass fiber of Comparative Example 3 is a glass fiber of which the $B_2O_3$, CaO and MgO contents do not satisfy the amount ranges specified in the present invention, and the glass fiber of Comparative Example 4 is a glass fiber of which the MgO content does not satisfy the amount range specified in the present invention.

Table 2 also shows measurement results of D glass and E glass as typical conventional products.

As shown in Table 1, the glasses of Examples have dielectric constants of 5 or less and dielectric tangents of $10 \times 10^{-4}$ or less, and all of these values are smaller than that of E glass. These values are smaller than, or almost equivalent to, those of D glass.

Further, as shown in Table 1, D glass shows a water-resistance loss of 3.7% by weight, while all the glass fibers of Examples show a water-resistance loss of 0.4% by weight or show a value equivalent to that of E glass and are excellent in water resistance.

Further, the spinning temperature, as an index for spinning, of the glass fibers of Examples is 1,340° C. or lower when their viscosity $\mu$ (Pa·s) is $\log \mu = 2.0$, so that $B_2O_3$ are not easily volatilized, and the glass fibers of Example all show a volatilization amount of 4 ppm or less and are excellent in productivity. When the volatilization amount of $B_2O_3$ is 4 ppm or less, adhering caused by a volatilization substance of $B_2O_3$ does not easily take place around a

TABLE 2

|  |  | Comparative Example | | | | D glass | E glass |
|---|---|---|---|---|---|---|---|
|  |  | 1 | 2 | 3 | 4 | | |
| Glass composition (wt %) | $SiO_2$ | 53.7 | 54.2 | 54.5 | 57.0 | 75.3 | 54.7 |
|  | $B_2O_3$ | 24.0 | 24.0 | 23.0 | 18.0 | 20.5 | 6.3 |
|  | $Al_2O_3$ | 12.0 | 13.0 | 14.0 | 17.0 | 0.0 | 14.3 |
|  | CaO | 1.5 | 4.0 | 5.7 | 0.0 | 0.6 | 22.7 |
|  | MgO | 8.5 | 3.0 | 0.0 | 7.7 | 0.4 | 0.6 |
|  | MgO + CaO | 10.0 | 7.0 | 5.7 | 7.7 | 1.0 | 23.3 |
|  | $Li_2O$ | 0.0 | 0.15 | 0.15 | 0.15 | 0.6 | 0.0 |
|  | $Na_2O$ | 0.0 | 0.15 | 0.15 | 0.15 | 1.1 | 0.3 |
|  | $K_2O$ | 0.0 | 0.00 | 0.00 | 0.00 | 1.5 | 0.1 |
|  | $Li_2O + Na_2O + K_2O$ | 0.0 | 0.30 | 0.30 | 0.30 | 3.2 | 0.4 |
|  | $TiO_2$ | 0.0 | 1.0 | 2.0 | 3.0 | 0.0 | 0.2 |
|  | $F_2$ | 0.0 | 0.5 | 0.5 | 0.5 | 0.0 | 0.5 |
| Properties | Dielectric constant | 4.7 | 4.6 | 4.6 | 4.8 | 4.3 | 6.7 |
|  | Dielectric tangent ($10^{-4}$) | 10 | 7 | 7 | 9 | 10 | 12 |
|  | Spinning temperature (° C.) | 1,300 | 1,320 | 1,330 | 1,320 | 1,410 | 1,200 |
|  | $B_2O_3$ volatilization amount (ppm) | 30 | 30 | 20 | 4 | 50 | 0.1 |
|  | Water-resistance loss | 3.5 | 0.9 | 1.4 | 1.5 | 3.7 | 0.4 | bushing nozzle due to a flow entailed by withdrawing of a glass, and the breaking of a glass fiber caused by the volatilization substance of $B_2O_3$ remarkably decreases.

On the other hand, as shown in Table 2, the glass fiber of Comparative Example 1 has a large water-resistance loss and a high dielectric tangent. The glass fiber of Comparative Example 2 shows a high $B_2O_3$ volatilization amount, and the glass fiber may break. The glass fiber of Comparative Example 3 shows a high $B_2O_3$ volatilization amount and also shows a large water resistance loss. The glass fiber of Comparative Example 4 shows a large water-resistant loss. It is therefore clear that all the glass fibers of Comparative Examples 1 to 4 are inferior to any one of the glass fibers of Examples 1 to 6.

INDUSTRIAL UTILITY

The glass fiber of the present invention has a low dielectric constant and a low dielectric tangent and is excellent as a glass fiber for printed wiring boards, particularly as a glass fiber for reinforcing printed wiring boards for high-density circuits. Further, it has excellent properties with regard to productivity, water resistance and low thermal expansion, so that there can be stably provided a quality-stabilized glass fiber particularly as a glass fiber for reinforcing printed wiring boards for high-density circuits.

A printed wiring board made of the glass fiber fabric of the present invention has characteristic features that a drilling position can be stably maintained and that a drill is less worn, so that highly reliable printed wiring boards can be stably obtained.

What is claimed is:

1. A low-dielectric-constant glass fiber having a glass composition consisting of, by weight %, 53 to 57% of $SiO_2$, 13 to 16% of $Al_2O_3$, 15 to 19% of $B_2O_3$, 3% to less than 6% of MgO, 2 to 4.7% of CaO, 1 to 4% of $TiO_2$, 0 to 0.3% of $Li_2O$, 0 to 0.3% of $Na_2O$, 0 to 0.5% of $K_2O$, and 0 to 1% of $F_2$, the content of MgO+CaO being 7 to 10% and the content of $Li_2O+Na_2O+K_2O$ being 0.2 to 0.5%, wherein the low-dielectric-constant glass has a dielectric constant of 5.0 or lower, a dielectric tangent $10 \times 10^{-4}$ or less, a spinning temperature (a temperature at which a glass viscosity comes to be $1 \times 10^2$ Pa·s) of 1,350° C. or lower, a $B_2O_3$ volatilization amount of 4 ppm or less and a water-resistance loss of 0.5% by weight or less.

2. The low-dielectric-constant glass fiber of claim 1, which is for use as a glass fiber for a printed wiring board.

3. A glass fiber fabric made of the low-dielectric-constant glass fiber recited in claim 1.

4. The glass fiber fabric of claim 3, wherein the low-dielectric-constant glass fiber has a glass composition comprising, by weight %, 0 to 0.2% of $Li_2O$, 0 to 0.2% of $Na_2O$, 0 to 0.2% of $K_2O$ and 0.2 to 1% of $F_2$.

5. The glass fiber fabric of claim 3, which is for use as a glass fiber fabric for a printed wiring board.

* * * * *